(12) United States Patent
Bahl et al.

(10) Patent No.: US 9,264,049 B2
(45) Date of Patent: Feb. 16, 2016

(54) SYNCHRONOUS ON-CHIP CLOCK CONTROLLERS

(71) Applicant: STMicroelectronics International N.V., Amsterdam (NL)

(72) Inventors: Swapnil Bahl, New Delhi (IN); Shray Khullar, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 114 days.

(21) Appl. No.: 14/086,110

(22) Filed: Nov. 21, 2013

(65) Prior Publication Data

US 2015/0137862 A1 May 21, 2015

(51) Int. Cl.
*G01R 31/28* (2006.01)
*H03L 7/06* (2006.01)

(52) U.S. Cl.
CPC ....................................... *H03L 7/06* (2013.01)

(58) Field of Classification Search
CPC ................. H03L 7/06; G01R 31/3177; G01R 31/318533; G01R 31/318552; G01R 31/318594; G01R 31/318575; G01R 31/31727; G01R 31/31725; G01R 31/318536; G01R 31/318555; G06F 11/22; G06F 1/06; H03K 3/012

See application file for complete search history.

(56) References Cited

U.S. PATENT DOCUMENTS

2008/0010573 A1*  1/2008  Sul ............................... 714/731
2011/0264971 A1* 10/2011  Bahl et al. .................... 714/731
2012/0166860 A1   6/2012  Khullar et al.

* cited by examiner

*Primary Examiner* — Guerrier Merant
(74) *Attorney, Agent, or Firm* — Gardere Wynne Sewell LLP

(57) ABSTRACT

A semiconductor chip includes on-chip clock controllers (OCCs) capable of synchronizing multiple clock signals on the device. Each OCC controller receives a scan enable signal and a unique clock signal that is generated from one or more clock generators. The OCC receiving the slowest generated clock signal passes it through internal meta-stability registers and provides an external synchronization signal to the OCCs handling faster clock signals. These faster-clock OCCs can use the external synchronization signal to synchronize their clocks and generate testing clock pulses.

22 Claims, 4 Drawing Sheets

SYNCHRONOUS ON-CHIP CLOCK CONTROLLERS

BACKGROUND

Automatic test pattern generation (ATPG) is used to identify test sequences that can be applied to test circuits on a chip to determine whether they function correctly. Conventional ATPG applies mathematically generated test patterns to targeted circuitry and logic of the chip commonly referred to as the "design under test" (or simply "DUT"). ATPG testing typically involves supplying a test pattern to the DUT using a series of flip-flops arranged in a scan chain configuration. Once test data is applied to the DUT, the output of the circuitry being tested is checked to see whether it matches an expected value. If it does not, a defect can be assumed.

A scan chain configuration includes multiple flip-flops connected in a sequential manner. These flip-flops are signaled by a "scan enable" signal to operate in two different modes: (1) a shift mode, and (2) a capture mode. In shift mode, a test pattern of data is shifted into the flip-flops in the chain one bit at a time. Once the test pattern is entirely shifted into flip-flops, the scan enable signal can switch to the capture mode during which testing of the DUT is performed by passing the shifted-in test value to the DUT. The DUT's output can then be analyzed to the see whether an expected value was returned. A single chip may have myriad DUTs requiring many chains of flip-flops spread across the chip to shift in the test pattern. The test pattern must be clocked in to the various flip-flops, and different test patterns will use different clock frequencies. So each DUT may require its own unique clock signal to ensure proper testing.

On-chip clock controllers (referred to herein simply as OCCs) are used on semiconductor chips to control the clocks in shifting and capturing data in and out of scan chain flip-flops. Conventional OCCs receive a clock signal unique to a particular clock domain of a chip and synchronize that clock signal with a testing clock signal using one or more shift registers. Unfortunately, the unique clock signals of the various OCCs on a chip become de-synchronized relative to each other because each OCC typically has its own set of synchronizing registers—which may differ in quantity, type or size from other OCCs on the chip—and independently synchronize their own clock signals at different times. Disparate OCCs with different synchronizing registers operating on different scan chains will cause errors in testing because the OCCs will operate independently.

Unsynchronized OCCs affect the quality of testing that can be performed using scan chains. They also make it difficult to accurately estimate power consumption for designs requiring more than one OCC because the predicted switching activity generated by simulations of the circuitry may be inaccurate. This is largely due to the occurrence of test clock pulses in each of the clock controllers that often result in two or more clock controllers pulsing at the same time and generating a spike in the power requirements of the circuitry being tested. The negative effects of such spiking behavior compound as the size of a system on chip (SoC) and the number of interacting clock domains therein increases.

SUMMARY

This Summary is provided to introduce a selection of concepts in a simplified form that are further described below in the Detailed Description. This Summary is not intended to identify key features or essential features of the claimed subject matter.

One embodiment relates to a semiconductor chip equipped with a series of OCCs that synchronize multiple clock signals across different clock domains. Each OCC includes a set of internal meta-stability registers (or flip-flops) and receives a scan enable signal, a phase-locked loop (PLL) clock signal, and a synchronous mode signal. The OCC receiving the slowest PLL clock signal clocks the scan enable signal through internal meta-stability registers according to the slow PLL clock signal and outputs the slow-clocked scan enable signal to other OCCs on the chip as a synchronization signal. The OCCs with faster PLL clock signals can use the synchronization signal to synchronize their respective PLL clock signals with the slow-clocked scan enable signal. While each OCC is equipped with the internal meta-stability registers, only the OCC receiving the slowest PLL clock signal will pass the scan enable signal through them, in one embodiment. The other OCCs will instead clock the synchronization signal coming from the slowest PLL-clock OCC by their faster PLL clock signals.

Each OCC is also equipped with an OCC engine circuit for generating clock pulses of its received PLL clock signal's frequency. In one embodiment, the OCC engine circuit includes a counter unit configured to count clock cycles of either the scan enable signal or the synchronization signal from another OCC clocked at the OCC's PLL clock signal. The OCC engine circuit generates clock pulses of the PLL clock signal upon instruction of a control unit. Selection of the scan enable signal or the synchronization signal for clock-pulse generation is signaled by the synchronous mode signal controlling a multiplexer or other switching element. Instead of a counter unit, alternative embodiments use a collection of shift registers and logic gates to generate the clock pulses upon instruction from the control unit.

Another embodiment relates to a system comprising a plurality of OCC controllers. A first OCC controller is configured to clock a scan enable signal through a first set of meta-stability registers and output the clocked scan enable signal as an external synchronization signal to a second OCC receiving a faster clock signal. The second OCC controller is configured to generate clock pulses of the external synchronization signal according to the fast clock signal.

The foregoing and other features and advantages of the present disclosure will become more apparent from the following detailed description of the embodiments read in conjunction with the accompanying drawings. The detailed description and drawings are merely illustrative of some different embodiments, rather than limiting the scope of the invention as defined by the appended claims and equivalents thereof.

DETAILED DESCRIPTION OF THE DRAWINGS

Embodiments discussed herein generally relate to OCCs that synchronize test clock pulses for scan chains testing DUTs on a semiconductor chip. The OCCs discussed herein can be placed on a semiconductor chip in multiple clock domains to ensure the clock signals in those domains are synchronized, with the slowest clock signal generated from a master clock. For purposes of this disclosure, a "clock domain" is a single clock signal used to drive and control a subset of flip-flops or circuitry on the chip. A chip may have hundreds of clock domains that, if not synchronized, could cause various bugs or glitches during testing.

Figure 1:
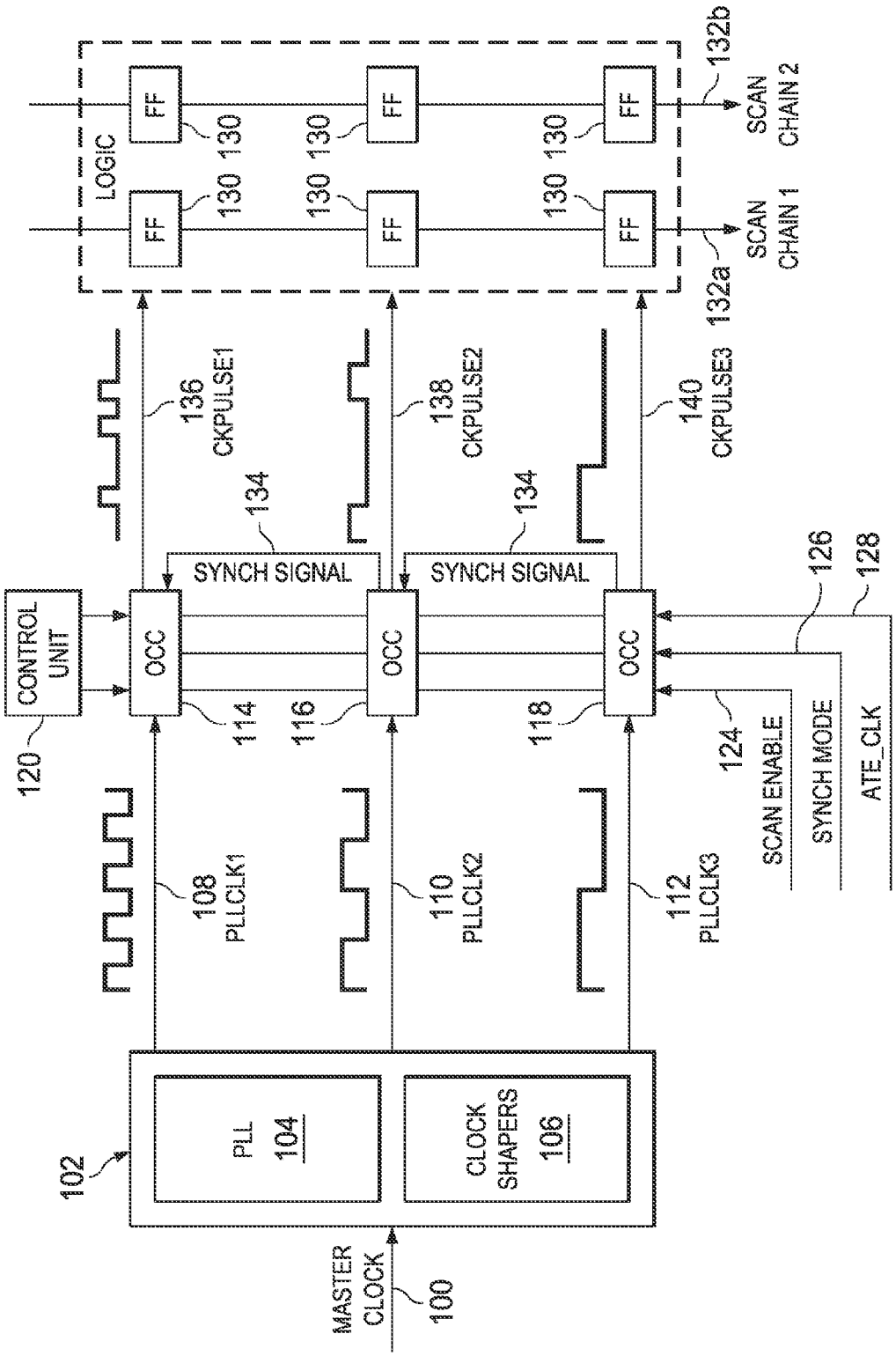
FIG. 1 is a block diagram of multiple OCCs synchronizing clock signals and generating clock pulses.

FIG. 1 is a block diagram of components on a semiconductor chip for generating synchronized testing clock pulses across multiple clock domains. A master clock signal 100 is received by a PLL signal generator 102 that includes a PLL unit 104 and clock shapers 106 for generating multiple PLL clock signals 108, 110, 112. While not shown, PLL unit 104 may include a phase detector, a loop filter, and an oscillator that operate to lock the phases of clock signals 108, 110, 112 to the master clock signal 100. Clock shapers 106 may include a multiplier, divider, delay, or other logic device capable of manipulating the frequency of the master clock signal 100. Using PLL unit 104 and clock shapers 106, PLL signal generator 102 produces multiple PLL clock signals with varying frequencies: PLLCLK1 108, PLLCLK2 110 and PLLCLK3 112. Additionally, OCCs 114, 116, 118 each receive a scan enable signal 124, a synchronization mode (synch mode) signal 126, an automated testing equipment (ATE) clock signal (ATE_CLK) 128 and pulse commands from a control unit 120.

PLLCLK1 108, PLLCLK2 110 and PLLCLK 112 are used on the same semiconductor chip to control scan testing for different clock domains. The illustrated embodiment shows PLLCLK3 112 being the slowest clock signal and PLLCLK1 108 being the fastest. Because PLLCLKs1-3 108-112 each originate from the same master clock signal 100, they are each synchronized with respect to each—i.e., the faster PLLCLK 1 108 and PLLCLK 2 110 are synchronized with the slowest PLLCLK 3 112.

Scan enable signal 124 provides an indication for switching flip-flops 130 of scan chains 132a or 132b in and out of shift and capture modes in order to test DUTs. When scan enable 124 signals shift mode, indicated in some embodiments by the scan enable signal 124 being asserted high, the OCCs 114-118 each pass the ATE_CLK 128. When the scan enable signal 124 is in capture mode, OCCs 114-118 generate clock pulses CKPULSE1 136, CKPULSE2 138 and CKPULSE3 140 as output signals. These output signals represent clock pulses of the respective frequencies of PLLCLK1 108, PLLCLK2 110 and PLLCLK3 112 that have been requested by the pulse commands of control unit 120. The pulse commands may be implemented as a sequence of bits instructive of when to generate a required clock pulse, such as during a specific clock cycle after synchronization with PLLCK3 112.

Figure 3:
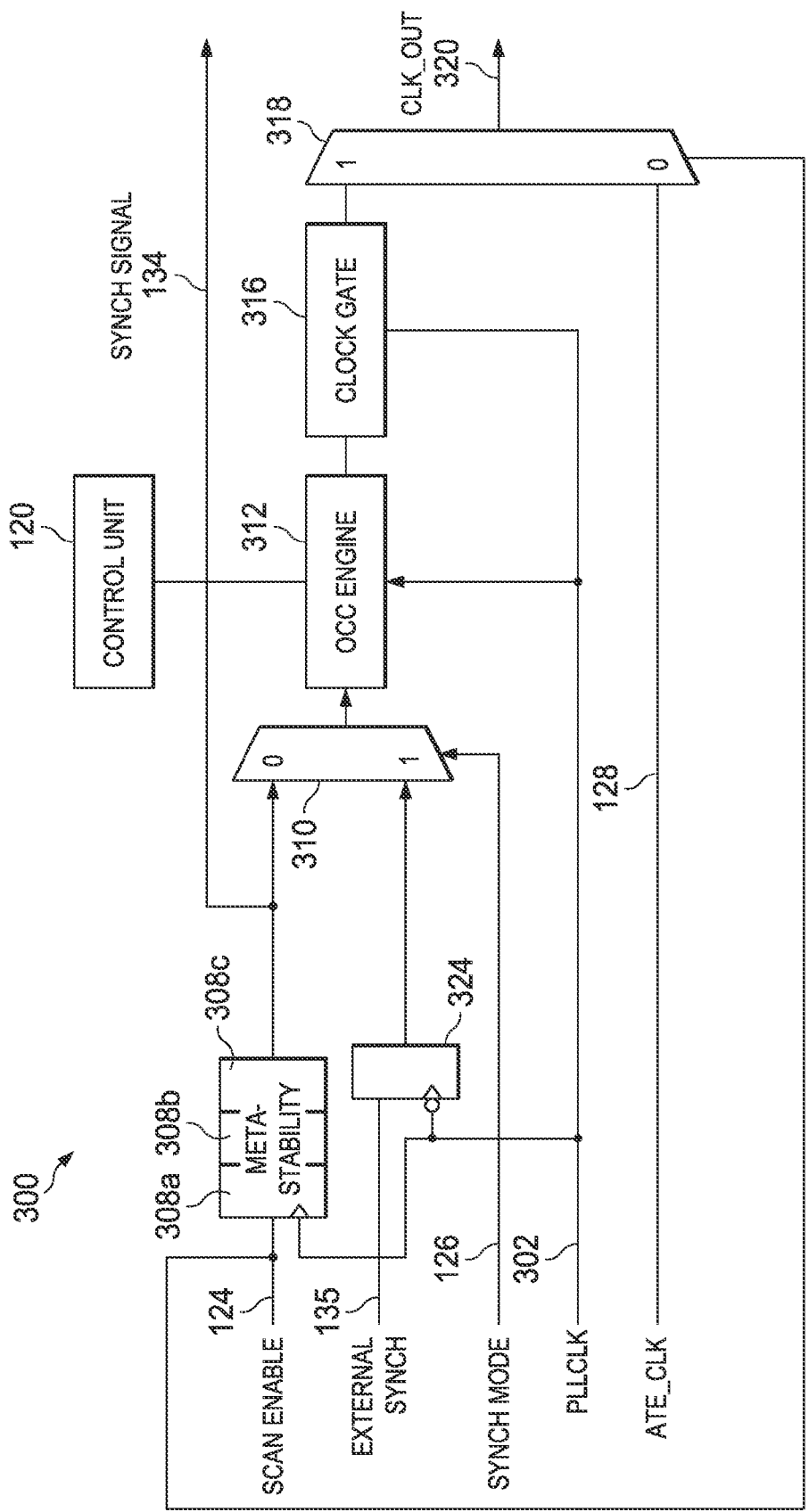
FIG. 3 is a block diagram of a synchronizing OCC controller.
Figure 4:
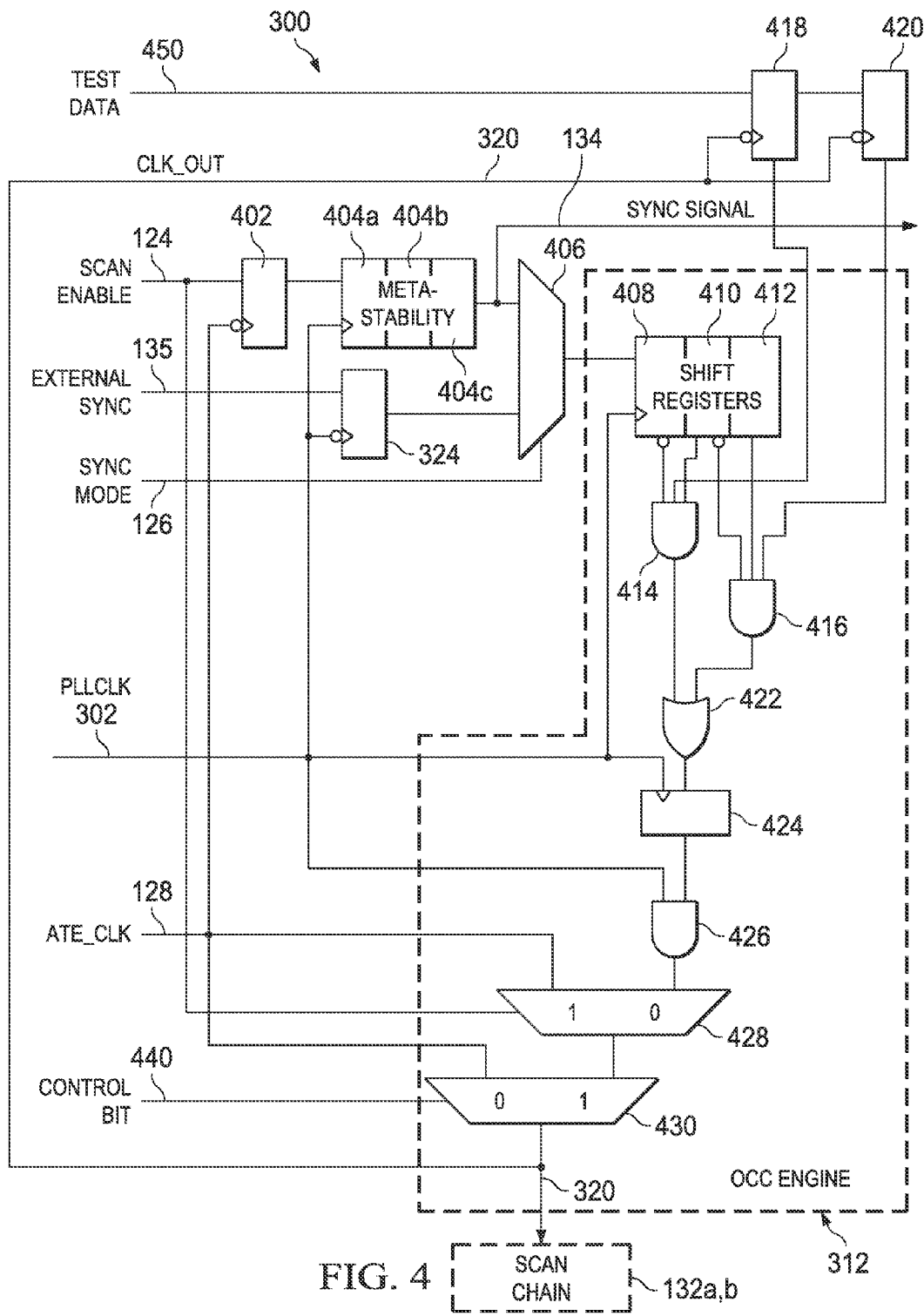
FIG. 4 is a logic diagram of a synchronizing OCC controller with a shift-register-based OCC engine.

Each OCC 114-118 has its own internal set of synchronization registers (referred to herein as "meta-stability registers" and discussed in detail in reference to FIGS. 3 and 4) that can selectively be used to clock the scan enable signal 124 according to the respectively received PLLCLK1-3 108-112. When each OCC 114-118 uses its own meta-stability registers, clocked scan enable signals 124 may become de-synchronized with respect to each other. To rectify this de-synchronization, embodiments use a synch mode signal 126 to trigger some or all of OCCs 114-118 to function in either a standard or a synchronous mode of operation. In standard mode, OCCs 114-118 functions in the traditional manner by synchronizing scan enable 124 with its respective PLLCLKs1-3 108-112 using the OCC's internal meta-stability registers. In synchronous mode, however, only the OCC 118 of the slowest PLLCLK3 112 synchronizes scan enable 124 using internal meta-stability registers, while OCCs 114 and 116 disengage their meta-stability registers. Thereafter, OCC 118 supplies the PLLCLK3 112-synchronized scan enable 124 signal to the next OCC 116 as synchronization (synch) signal 134, OCC 116 subsequently passes the synch signal 134 to OCC 114, and so on across other OCCs of different clock domains. Thus, when the OCCs 114-118 operate in the synchronous mode, only the slowest OCC 118 uses its internal meta-stability registers to synchronize the scan enable signal 124. This eliminates any de-synchronization of scan enable 124 caused by its passage through the meta-stability registers of OCCs 114 and 116.

OCCs 114-118 each include an OCC engine (not shown) that generates output clock pulses CKPULSE1-3 136-140 based on the pulse commands of control unit 120. The OCC engines may use a counter or a collection of shift registers to generate the clock pulses. Embodiments using a counter are discussed below in reference to FIG. 3, and embodiments using shift registers are discussed below in reference to FIG. 4.

CKPULSEs1-3 136-140 are provided to the flip-flops 130 of scan chains 132a and 132b. Scan chains 132a and 132b represent two distinct scan chains that can either be tested by the clock pulses or pass data to particular DUTs of a semiconductor ship. While only two scan chains are shown for the sake of clarity, in reality, many scan chains 132 may be configured to receive the clock pulses of the OCCs discussed herein.

Figure 2:
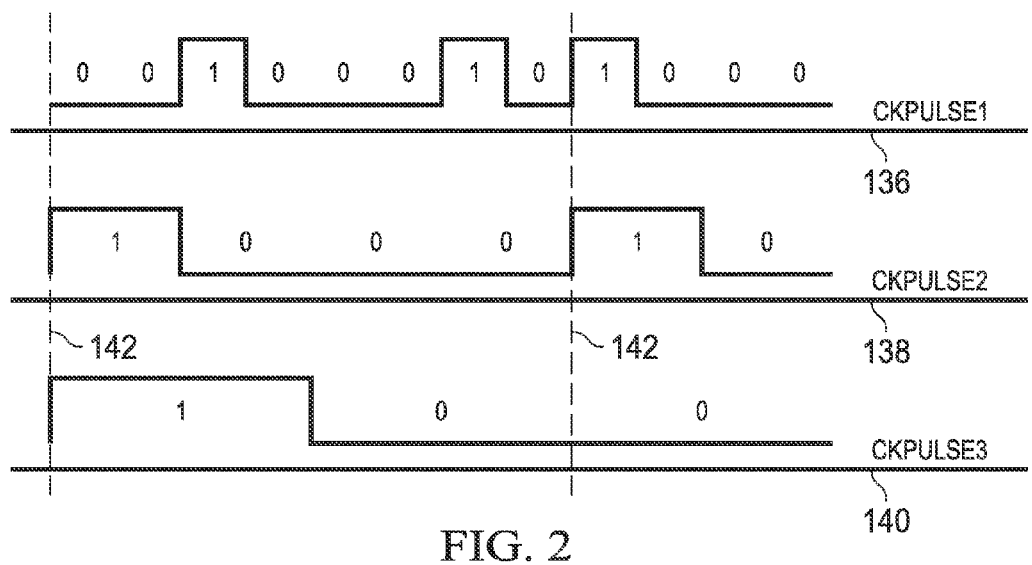
FIG. 2 is a waveform diagram of synchronized clock pulses generated by multiple OCCs having different frequencies.

FIG. 2 is a waveform diagram of clock pulses CKPULSE1-3 136-140 generated by OCCs 114-118, respectively. These same clock pulse patterns are illustrated in FIG. 1 but are shown in a larger version here for further clarity. Again, as previously mentioned, OCCs 114-118 only generate clock pulses whenever the scan enable signal 124 indicates the capture mode; otherwise, the OCCs 114-118 output ATE_CLK 128. The illustrated embodiment shows CKPULSEs1-3 136-140 generated during a two clock cycle timeframe of PLLCLK3 112, as indicated by the two dotted lines 142.

To ensure that all three clock pulse signals are synchronized, faster CKPULSEs2-3 138-140 are initially synchronized to the rising edge of slowest PLL clock signal PLLCLK3 112—as shown by the leftmost dotted line 142. Once synchronized, OCCs 114-118 can generate pulses of respective PLLCLKs1-3 108-112 as instructed by control unit 120. Some embodiments will use a counter to translate control unit 120's instructions into clock pulses, and other embodiments use a shift-register configuration. Each OCC 114-118 can generate clock pulses at any clock cycles of its respective PLLCLK1-3 108-112. As shown, for example, CKPULSE1 136 includes three clock pulses of PLLCLK1 108 generated at the second, fourth, and fifth clock cycles of PLLCLK1 108 after synchronization with PLLCLK3 112. CKPULSE2 138 includes two clock pulses of PLLCLK2 110 generated at the first and third clock cycles of PLLCLK2 110 after synchronization with PLLCLK3 112. CKPULSE3 140 includes one clock pulse of PLLCLK3 112 generated at the first clock cycle of PLLCLK3 112.

FIG. 3 is a block diagram of one embodiment of an OCC controller 300 that uses an OCC engine 312 to generate clock pulses. The OCC controller 300 receives five inputs: scan enable signal 124; an external synchronization (external synch) signal 135, a synch mode signal 126, a PLLCLK 302, and an ATE_CLK 128. PLLCLK 302 is the received PLLCLK signal, such as PLLCLK1-3 108-112, being supplied to OCC 300. OCC 300 can be connected to other instances of OCC 300 in other clock domains on a chip. In operation, OCC 300 provides either ATE_CLK 128 or clock pulses of PLLCLK 302 as CLK_OUT 320 depending on the modes indicated by scan enable signal 124 and synch mode 126. External synch 135 is an input for receiving synch signal 134 from another OCC 300, and synch signal 134 is shown as an output of OCC 300 for supply to another OCC 300 in a different clock domain. The synch signal 134 of one OCC 300 becomes the external synch signal 135 of the next OCC 300.

Scan enable 124 signaling the shift mode triggers multiplexer 318 to output ATE_CLK 128 as CLK_OUT 320. Conversely, when scan enable 124 signals the capture mode, multiplexer 318 is triggered to output clock pulses as CLK_OUT 320. To generate clock pulses, OCC 300 provides the OCC engine with either: (1) the scan enable signal 124 clocked by the meta-stability registers 308a-c at the PLLCLK 302, or (2) the external synch signal 135 (which is the scan enable signal 124 clocked at a slower OCC 300 clocked at the inverse of PLLCLK 302.

When synch mode 126 signals the standard mode, meta-stability registers 308a-c are used to clock scan enable 124 according to the input PLLCLK 302. The clocked scan enable signal 124 output from the meta-stability registers 308a-c is provided to multiplexer 310 and is also transmitted out of OCC 300 as synch signal 134 to another OCC 300—for example, OCC 116 or 118.

When synch mode 126 signals the synchronous mode, the meta-stability registers 308a-c are disengaged, and external synch 135, which is received from the previous OCC 300, is passed through flip-flop 324 to multiplexer 310. External synch 135 is the scan enable signal 124 clocked by another OCC 300 at the slowest PLLCLK (PLLCLK3 112). Flip-flop 324 is clocked by an inverted clock signal of PLLCLK 302, in one embodiment. Clocking external synch 135 at PLLCLK 302 synchronizes PLLCLK 302 with the slowest PLL clock signal, i.e., PLLCLK3 112. Alternative embodiments do not use flip-flop 324 and instead provide external synch 135 directly to multiplexer 310.

Multiplexer 310 receives the scan enable signal 124 after being passed through the meta-stability registers 308a-c and external synch 135, either directly or after being clocked by flip-flop 324, and provides one of the two to the OCC engine 312 based on the synch mode signal 126. Multiplexer 310 selects which to provide to the OCC engine 312 based on the synch mode signal 126 indicating either standard or synchronous mode of operation. As previously stated, scan enable 124 is passed through the meta-stability registers 308a-c in the standard mode, and the external synch signal 135 is provided in the synchronous mode. Thus, the synch mode signal 126 provides a way to disengage the meta-stability registers 308a-c in all the OCCs 300 on a chip except for the OCC 300 receiving the slowest PLLCLK clock signal. The rest of the OCCs 300 synchronize their PLLCLKs by clocking the external synch signal 135 at their respective PLLCLK 302, clock pulses are generated when the synchronized PLLCLK 302 is provided to the OCC engine 312. OCC engine 312 generates clock pulses on command of the control unit 120 for output through multiplexer 318 as CLK_OUT 320. Clock gate 316 may be used in some embodiments, though not all, to clock the generated clock pulses from OCC engine 312 by PLLCLK 302.

The OCC engine 312 includes circuitry that generates clock pulses of either PLLCLK 302 or external synch 135 on command of the control unit 120. In one embodiment, OCC engine 312 comprises circuitry that includes a counter unit. While numerous techniques exist for constructing a counter unit, one embodiment uses N number of flip-flops connected in series with each's clock input tied to PLLCLK 302. In one embodiment, control unit 120 supplies the counter unit of OCC engine 312 with an indication of which clock cycles of PLLCLK 302 or synchronized external synch 135 the counter unit should generate clock pulses on, such as those shown in the waveforms of FIG. 2. The counter unit can then count clock cycles of PLLCLK 302 or synchronized external synch 135 and generate clock pulses on the edges (rising or falling) of selected PLLCLK 302's or external synch 135's clock cycles. For example, OCC 114 may function as OCC 300 to count cycles of PLLCLK1 108 and generate clock pulses CKPULSE1 136 on certain clock cycles of PLLCLK1 108 specified by control unit 120, such as on the second, third, fifth, and eighth rising edges of PLLCLK1 108. Similarly, OCCs 116 and 118 may respectively generate clock pulses CKPULSE2 138 on the first, second, and third rising edges of PLLCLK2 110 and CKPULSE3 140 on the third and sixth rising edges of PLLCLK3 112.

In one embodiment, the pulse commands from control unit 120 are communicated in the form of a group of pulse bits to the OCC engine 312. The pulse bits indicate which count of PLLCLK 302 or synchronized external synch 135 to generate clock pulses. For example, pulse bits 0101 may signal the counter unit to generate PLLCLK 302 or synchronized external synch 135 clock pulses on the second and fourth counted clock cycles of the synchronized clock. In another example, these same pulse bits may be interpreted in a pure binary manner to indicate that clock pulses should occur on the third counted cycle. As previously mentioned, counting and generation of clock pulses only occurs when the scan enable signal 124 is in the capture mode; in shift mode, ATE_CLK 128 is output as CLK_OUT 320. In some embodiments, a clock gate 316 receives the generated clock pulses and the PLLCLK 302, and synchronizes the clock pulses to PLLCLK 302; however, clock gate 316 is optional and is not used in all embodiments.

FIG. 4 is a logic diagram of OCC 300 with a shift-register-based OCC engine 312 and a control unit comprising two flip-flops 418 and 420. The OCC 300 receives five inputs: the scan enable signal 124; the external synch signal 135, the synch mode signal 126, the PLLCLK 302, and the ATE_CLK 128. OCC 300 is connected to other instances of OCC 300 and, in operation, provides the output synch signal 134 to a subsequent OCC 300. Thus, synch signal 134 is received and passed through OCC 300 to the next OCC 300. Depending on various signaling, OCC 300 outputs as CLK_OUT 320 either ATE_CLK 128, pulses of scan enable 124 clocked at PLLCLK 302, or pulses of synchronized external synch 135 clocked at the inverse of PLLCLK 302.

When synch mode 126 indicates the standard mode of operation, flip-flop 402 clocks scan enable 124 according to ATE_CLK 128, and the output of flip-flop 402 is clocked according to PLLCLK 302 through flip-flops 404a-c of the meta-stability registers. While only three flip-flops 404a-c are shown and indicated to be the same size, embodiments may alternatively include meta-stability registers 404a-c of varying size or different quantities. The clocked scan enable signal 124 output from the meta-stability registers 404a-c is provided to multiplexer 406 and is also transmitted out of OCC 300 as synch signal 134 to another OCC 300. The synch signal 134 of one OCC 300 is received as the external synch signal 135 of the next OCC 300.

External synch 135 is an output clock signal from another OCC 300 and is clocked by flip-flop 324 at the inverse of PLLCLK 302. Both outputs of the meta-stability registers 404a-c and the flip-flop 324 are received by multiplexer 406, and the synch mode signal 126 selects between the two based on synch mode 126 indicating either a standard or synchronous mode of operation. When synch mode 126 signals the standard mode, the output of the meta-stability registers 404a-c is passed through multiplexer 406 to the OCC engine 312. When synch mode 126 indicates the synchronous mode, the output of flip-flop 324 (i.e., external synch 135 clocked at the inverse of PLLCLK 302) gets passed.

The OCC engine 312 is a circuit that includes a group of shift registers comprising flip-flops 408-412; NAND gates 414, 416 and 426; NOR gate 422; flip-flop 424; and multiplexers 428 and 430. The output of multiplexer 406 (either scan enable 124 through the meta-stability registers 404a-c or external synch 135 through flip-flop 324) is clocked through the shift register flip-flops 408-412 at a clock rate of PLLCLK 302. The OCC engine 312 receives pulse commands from flip-flops 418 and 420 of the control unit 120 that instruct the OCC engine 312 when to generate clock pulses of the output of multiplexer 406 by being asserted high, in one embodiment.

In another embodiment, the pulse commands from flip-flops 418 and 420 indicate bit values that can be used by the logic of the OCC engine 312 to generate a requested number of clock pulses of PLLCLK 302 and synchronized external synch 135. The pulse commands are based on test data 450 being clocked in to flip-flops 418 and 420 at the inverse of CLK_OUT 320.

AND gates 414 and 416 receive outputs of the shift register's flip-flops 408-412 and the control unit's flip-flops 418-420 and control the generation of the clock pulses. Specifically, AND gate 414 receives the inverted output of flip-flop 408, the non-inverted output of flip-flop 410, and the non-inverted output of flip-flop 418. AND gate 416 receives the inverted output of flip-flop 410, the non-inverted output of flip-flop 412, and the non-inverted output of flip-flop 420. The outputs of AND gates 414 and 416 are received as inputs to OR gate 422, and OR gate 422 provides its outputs to flip-flop 424, which is clocked by PLLCLK 302. The output generated by the flip-flop 424 and the PLLCLK 302 are received as inputs to AND gate 426. The output of AND gate 426 is provided as one input to multiplexer 428, and ATE_CLK 128 is provided as the other input.

Scan enable 124 is used to select between the two inputs of multiplexer 428, passing either the ATE_CLK 128 in shift mode and the output of AND gate 426 in capture mode. The output provided by multiplexer 426 and PLLCLK 302 are received as inputs to multiplexer 430, which is controlled by an optional control bit signal 440 from control unit 120. Control bit signal 440 is received from control unit 120 and provides a way to force the OCC engine 312 to pass ATE_CLK 128 without using scan enable 124, such as during testing, by being used as the selector input to multiplexer 420. Control bit signal 440 and multiplexer 430 are optional and may not be included in all embodiments. Multiplexer 430, or 428 in some embodiments, provides CLK_OUT 320 for supply to scan chains 132a or b. Inverted CLK_OUT 320 is also used to clock in test data 450 to flip-flops 418 and 420.

The previously described circuitry for OCCs 300 and control unit 120 are merely examples of different embodiments. Other embodiments may use different or equivalent circuit designs, implementations or layouts. It should be appreciated that the various embodiments disclosed herein are exemplary. Accordingly, various modifications to these embodiments may be made without departing from the scope of the present disclosure and the claims provided below. The claimed subject matter might also be embodied in other ways, to include different steps or combinations of steps similar to the ones described herein, in conjunction with other present or future technologies.

What is claimed is:

1. An on-chip clock (OCC) controller receiving a scan enable signal, a first clock signal, and a synchronous mode signal, the OCC controller comprising:
   one or more meta-stability registers configured to synchronize the scan enable signal with the first clock signal when the synchronous mode signal is in a first state; and
   an OCC engine circuit configured to receive pulse commands from a control unit and generate:
      first clock pulses of the scan enable signal synchronized with the first clock signal by the one or more meta-stability registers according to the pulse commands when the synchronous mode signal is in the first state,
      second clock pulses of an external synchronization signal synchronized with the first clock signal according to the pulse commands when the synchronous mode signal is in a second state, and
      a counter unit configured to count clock cycles of the first clock signal and generate the first clock pulses or the second clock pulses based on the counted clock cycles.

2. The OCC controller of claim 1, wherein the scan enable signal indicates a shift mode of operation or a capture mode of operation, and the OCC engine circuit is configured to generate the first and second clock pulses only during the capture mode of operation.

3. The OCC controller of claim 1, wherein the one or more meta-stability registers are disengaged whenever the synchronous mode signal indicates the second state.

4. The OCC controller of claim 1, wherein the OCC controller receives an automated test equipment (ATE) clock signal that the OCC engine circuit outputs when the scan enable signal indicates a shift mode of operation.

5. The OCC controller of claim 1, wherein the external synchronization signal is received from a second OCC controller controlling a second clock domain.

6. The OCC controller of claim 1, wherein the OCC engine circuit comprises shift registers configured to:
   receive the scan enable signal synchronized with the first clock signal by the one or more meta-stability registers when the synchronous mode signal is in the first state,
   receive the external synchronization signal when the synchronous mode signal is in a second state, and
   provide register outputs to logic gates for generating the first or second clock pulses.

7. The OCC controller of claim 6, wherein the OCC engine circuit is configured to generate the first or second clock pulses after the external synchronization signal is synchronized with the first clock signal.

8. The OCC controller of claim 1, wherein the first and second clock pulses are provided to one or more flip-flops in a scan chain.

9. The OCC controller of claim 1, wherein the scan enable signal synchronized with the first clock signal by the one or more meta-stability registers is provided as synchronization signal to a second OCC controller.

10. An on-chip clock (OCC) controller comprising:
   inputs configured to receive a scan enable signal, an external synchronization signal from another OCC controller, a synchronization mode signal, and a clock signal;
   a switching element configured to output, based on the synchronization mode signal, either the external synchronization signal or an output of one or more meta-stability registers clocking the scan enable signal according to the clock signal; and an OCC engine circuit configured to receive pulse commands and generate clock pulses of either the external synchronizations signal or the scan enable signal clocked through the one or more meta-stability registers.

11. The OCC controller of claim 10, wherein the OCC engine comprises a counter unit configured to count clock cycles of the first clock signal for use in generation of the clock pulses.

12. The OCC controller of claim 11, wherein the OCC engine comprises a group of shift registers configured to clock the output of the switching element according to the clock signal and provide register outputs to logic gates for generation of the clock pulses.

13. A system, comprising:

a first on-chip clock (OCC) controller configured to receive a scan enable signal and a slower clock signal, clock the scan enable signal through a first set of meta-stability registers, and output the clocked scan enable signal as an external synchronization signal;

a second OCC controller configured to receive the scan enable signal, a faster clock signal, and the external synchronization signal from the first OCC and generate clock pulses of the external synchronization signal according to the faster clock signal; and wherein the second OCC controller comprises a counter unit configured to count clock cycles of the faster clock signal.

14. The system of claim 13, wherein the second OCC controller is configured to generate clock pulses of the external synchronization signal clocked according to the faster clock signal when a received synchronization mode signal indicates a first state.

15. The system of claim 14, wherein the second OCC controller further comprises a second set of meta-stability registers and is configured to clock the scan enable signal through the second set of meta-stability registers when the synchronization mode signal indicates a second state.

16. The system of claim 13, wherein the second OCC controller comprises a plurality of shift registers that receive the external synchronization signal and provide register outputs to one or more logic gates for generating the clock pulses.

17. The system of claim 13, further comprising a control unit configured to provide pulse commands for generating the clock pulses to the second OCC controller.

18. The system of claim 13, wherein the second OCC controller only generates the clock pulses when the scan enable signal indicates a capture mode of operation.

19. An on-chip clock (OCC) controller receiving a scan enable signal, a clock signal, and a synchronous mode signal, the OCC controller comprising:

a meta-stability register having a first input configured to receive the scan enable signal, a second input configured to receive a clock signal and an output configured to generate a first synchronization signal;

a flip flop having a first input configured to receive a second synchronization signal, a second input configured to receive the clock signal and an output configured to output a third synchronization signal;

a multiplexer circuit having a first input configured to receive the first synchronization signal, a second input configured to receive the third synchronization signal and an output configured to output one of the first and third synchronization signals as selected by said synchronous mode signal; and an OCC engine circuit configured to receive pulse commands from a control unit and receive the multiplexer circuit selected one of the first and third synchronization signals, said OCC engine circuit further configured to generate clock pulses based on the pulse commands and the selected one of the first and third synchronization signals.

20. The OCC controller of claim 19, wherein the scan enable signal indicates one of a shift mode of operation or a capture mode of operation, and wherein the OCC engine circuit is further configured to generate the clock pulses when the scan enable signal indicates the capture mode of operation.

21. The OCC controller of claim 19, wherein the OCC engine circuit comprises a counter unit configured to count clock cycles of the first clock signal and generate the clock pulses based on the counted clock cycles.

22. The OCC controller of claim 19, wherein the OCC engine circuit further comprises:

a shift register configured to receive the selected one of the first and third synchronization signals; and logic gates coupled to outputs of the shift register to generate said clock pulses.

* * * * *